United States Patent
Arai et al.

(10) Patent No.: US 8,049,572 B2
(45) Date of Patent: Nov. 1, 2011

(54) OVEN-CONTROLLED CRYSTAL OSCILLATOR

(75) Inventors: Junichi Arai, Saitama (JP); Kenji Kasahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 365 days.

(21) Appl. No.: 12/378,741

(22) Filed: Feb. 19, 2009

(65) Prior Publication Data

US 2009/0212878 A1    Aug. 27, 2009

(30) Foreign Application Priority Data

Feb. 21, 2008 (JP) ................. 2008-040340

(51) Int. Cl.
*H03B 5/36* (2006.01)
*H03L 1/02* (2006.01)

(52) U.S. Cl. ............. 331/176; 331/108 C; 331/158
(58) Field of Classification Search ........... 331/108 C, 331/158, 176

See application file for complete search history.

(56) References Cited

U.S. PATENT DOCUMENTS 7,345,552 B2    3/2008  Ito et al.
7,382,204 B2 *  6/2008  Arai et al. ............. 331/69

FOREIGN PATENT DOCUMENTS

| JP | 1-146618 | 10/1989 |
| JP | 2001-127579 | 5/2001 |
| JP | 2001-308640 | 11/2001 |
| JP | 2002324418 | 11/2002 |
| JP | 2003112838 | 4/2003 |
| JP | 2006-311496 | 11/2006 |

* cited by examiner

*Primary Examiner* — Robert Pascal
*Assistant Examiner* — James Goodley
(74) *Attorney, Agent, or Firm* — Muirhead and Saturnelli, LLC

(57) ABSTRACT

An oven-controlled crystal oscillator includes a circuit board, a crystal unit surface-mounted on the circuit board, and a temperature control circuit that maintains operating temperature of the crystal unit constant. The temperature control circuit includes a heating resistor, a power transistor that supplies power to a heating resistor, and a temperature sensitive resistor that detects temperature of the crystal unit. The heating resistor is formed, as a film resistor, on a surface of the circuit board in an area thereof in which the crystal unit is located. The temperature sensitive resistor is provided on the circuit board as a film resistor.

6 Claims, 7 Drawing Sheets

OVEN-CONTROLLED CRYSTAL OSCILLATOR

BACKGROUND OF THE INVENTION

1. Field of the Invention

The present invention relates to an oven-controlled crystal oscillator that uses a surface-mount type quartz crystal unit, and in particular, to an oven-controlled crystal oscillator that is excellent in responsiveness to a change in temperature.

2. Description of the Related Art

A crystal oscillator includes a crystal unit composed of a quartz crystal blank hermetically encapsulated in a container and an oscillation circuit that uses the crystal unit; the crystal unit and the oscillation circuit are integrated together. The crystal oscillator is used in various electronic apparatuses as a reference source for frequency and time. One of such crystal oscillators is an oven-controlled crystal oscillator that maintains operating temperature of the crystal unit constant. Since the operating temperature of the crystal unit is maintained constant regardless of ambient temperature, the oven-controlled crystal oscillator offers particularly high frequency stability, and thus exhibits; for example, a frequency deviation of at most about 0.05 ppm. Such an oven-controlled crystal oscillator is used in, for example, communication facilities such as base stations for optical communication To maintain the crystal unit in the oven-controlled crystal oscillator at a constant temperature, a thermostatic chamber is generally used. The oven-controlled crystal oscillator is also called a crystal oscillator with a thermostatic chamber. In recent years, with increasing miniaturization of the communication facilities, the oven-controlled crystal oscillator has needed to be small. To miniaturize the oven-controlled crystal oscillator, for example, U.S. Pat. No. 7,345,552 and U.S. Pat. No. 7,382,204 disclose the use of a surface-mount type crystal unit as a crystal unit incorporated into the oven-controlled crystal oscillator. The surface-mount type crystal unit has a configuration suitable for surface-mounting on a circuit board and is characterized by a significantly small size compared to the sizes of conventional crystal units with leads FIG. 1A is a sectional view showing an example of a configuration of a conventional oven-controlled crystal oscillator that uses a surface-mount type crystal unit. FIG. 1B is a bottom view of a surface-mount type crystal unit used in the crystal oscillator. FIG. 1C is a circuit diagram of a temperature control circuit in the crystal oscillator.

The illustrated oven-controlled crystal oscillator includes surface-mount type crystal unit 1, a plurality of oscillating elements 2 forming an oscillation circuit, and temperature control circuit 3 that maintains the operating temperature of surface-mount type crystal unit 1 constant. Crystal unit 1, oscillating elements 2, and temperature control circuit 3 are arranged on circuit board 4 and hermetically encapsulated in metal container 5 together with circuit board 4. Crystal unit 1 uses flat, substantially parallelepipedic container body 6 made up of ceramics. Crystal unit 1 includes quartz crystal blank 1A accommodated in a recess formed on one principal surface of container body 6 and closed by metal cover 7. Crystal blank 1A is secured to an inner bottom surface of the recess and hermetically encapsulated in container body 6. Mounting terminals used for surface-mounting the crystal unit on a wiring board are formed, as electrode layers with a rectangular planar shape, in four corners of an outer bottom surface of container body 6, that is, a principal surface of container body 6 on which no recess is formed. Of the four mounting terminals, two mounting terminals positioned at opposite ends of one diagonal line of the outer bottom surface of container body 6 are connection terminals 8a electrically connected to a pair of excitation electrodes (not shown) of crystal blank 1A. The remaining two mounting terminals are dummy terminals 8b normally electrically connected to metal cover 7 via via-holes (not shown) formed in container body 6. Dummy terminals 8b can be connected to, for example, a ground potential.

Temperature control circuit 3 maintains the operating temperature of crystal unit 1 constant, and includes at least heating chip resistor 3a, temperature sensitive resistor 3b that detects operation temperature of crystal unit 1, and power transistor 3c. For example, a thermistor with a resistance value decreasing with increasing temperature is used as temperature sensitive resistor 3b. Power transistor 3c supplies heating chip resistor 3a with power controlled by the resistance value of temperature sensitive resistor 3b which varies with temperature.

Specifically, as shown in FIG. 1C, temperature control circuit 3 includes differential amplifier 12 with its output connected to a base of power transistor 3c, and heating chip resistor 3a is interposed between a collector of transistor 3c and direct-current power supply PC. FIG. 1C shows only one chip resistor 3a. However, for example, two chip resistors 3a are provided in parallel for uniform heat conduction. An emitter of transistor 3c is grounded. Temperature sensitive resistor 3b and resistor Ra are provided in series between power supply DC and the ground point. When a voltage appearing at a connection point between temperature sensitive resistor 3b and resistor Ra is defined as a temperature sensitive voltage, the temperature sensitive voltage is supplied to one input terminal of differential amplifier 12. Furthermore, resistors Rb, Rc are provided in series between power supply DC and the ground point to divide a power supply voltage to generate a reference voltage. The reference voltage is supplied to the other input terminal of differential amplifier 12. In this configuration, the base of power transistor 3c is supplied with a voltage corresponding to a differential voltage between the temperature sensitive voltage, which depends on temperature, and the constant reference voltage. Chip resistor 3a is thus supplied with power from power supply DC. As a result, the power supplied to chip resistor 3a is controlled according to temperature measured by temperature sensitive resistor 3b to maintain the operating temperature of crystal unit 1 constant.

Circuit board 4 is made up of first board 4a and second board 4b held on first board 4a with a plurality of metal pins 9. Metal pins 9 include a function of electrically connecting second board 4b to first board 4a. First board 4a is made up of a glass-epoxy wiring board. Circuit elements 2x are mounted on a lower surface of first board 4a. Here, circuit elements 2x are circuit elements which make up the crystal oscillator but are other the crystal unit 1, adjustable element 2A, heating chip resistor 3a, temperature sensitive resistor 3b, and power transistor 3c.

Second board 4b is made up of a ceramic wiring board and includes crystal unit 1 provided on an upper surface thereof by surface-mounting. Circuit elements which make up temperature control circuit but are other than power transistor 3c are provided on a lower surface of second board 4b. Specifically, heating chip resistor 3a and temperature sensitive resistor 3b are provided on the lower surface of second board 4b.

Second board 4b is positioned above first board 4a. Silicone-based conductive resin 10 is applied to between first board 4a and second board 4b so as to cover heating chip resistor 3a and temperature sensitive resistor 3b. Power transistor 3c is a circuit element with a large height dimension and is thus provided on the upper surface of second board 4b closer to an end thereof.

Metal container 5 is made up of metal base 5a and metal cover 5b. Air-tight terminals 11 are provided which penetrate metal base 5a to hold first board 4a. Cover 5b is joined to metal base 5a by resistance welding. Thus, first and second boards 4a, 4b and the circuit elements mounted on the boards are hermetically encapsulated in the metal container.

To manufacture such an oven-controlled crystal oscillator, first, circuit board 4 with the circuit elements mounted thereon is placed on air-tight terminals 11 so as to be held thereon. Then, frequency-temperature characteristics of crystal unit 1 are individually measured before metal cover 5b is connected to metal base 5a. In general, the frequency-temperature characteristics of crystal unit 1 are expressed by a cubic curve for temperature in which a high temperature-side extremal corresponds to the minimum value, whereas a low temperature-side extremal corresponds to the maximum value. Thus, a measured temperature offering the high temperature-side local minimal value, for example, 80° C. is set to be the operating temperature of the crystal unit. Resistor Ra in temperature control circuit 3 is adjusted so that temperature control circuit 3 can keep the temperature of the crystal unit equal to the operating temperature. A adjusting capacitor (not shown) in the oscillation circuit matches oscillation frequency f with a nominal frequency.

Elements such as resistor Ra and the adjusting capacitor which require replacement and adjustment are provided, for example, in an outer peripheral portion of second board 4b as adjustable elements 2A.

In the above-described oven-controlled crystal oscillator, temperature control circuit 3, including heating chip resistor 3a, and crystal unit 1 are provided on second board 4b, composed of ceramics, which offers a high heat conductivity. This enables an increase in the efficiency of heat transmission between temperature control circuit 3 and crystal unit 1. First board 4a is composed of a glass-epoxy wiring board, offering a low heat conductivity. This enables heat dispersion to be suppressed. In this manner, a thermostatic chamber structure with a high energy utilization efficiency can be provided, and the oven-controlled crystal oscillator can be miniaturized.

In the oven-controlled crystal oscillator, heating chip resistor 3a and temperature sensitive resistor 3b of a temperature control circuit are provided on a principal surface of second board 4b which lies opposite a principal surface thereof on which crystal unit 1 is provided. Heat from chip resistor 3a travels to crystal unit 1 via second board 4b and a gap between the bottom surface of crystal unit 1 and second board 4b. The heat then reaches crystal blank 1A. On the other hand, on the lower surface of second board 4b, temperature sensitive resistor 3b is provided in proximity to heating chip resistor 3a. Thus, heat generated by chip resistor 3a travels earlier to temperature sensitive resistor 3b than to crystal unit 1. From a transient viewpoint, temperature sensitive resistor 3b detects the heating temperature of chip resistor 3a rather than the temperature of crystal unit 1. As a result, at the time of a change in temperature, the temperature of crystal unit 1 changes depending on the heating temperature of heating chip resistor 3a rather than becoming equal to a preset operating temperature. This prevents the temperature control of the crystal unit from properly following a change in temperature.

U.S. Pat. No. 7,382,204 proposes a configuration in which dummy terminal 8b of crystal unit 1 is connected to temperature sensitive resistor 3b in order to allow the temperature of crystal unit 1 to be easily transmitted to temperature sensitive resistor 3b. For example, as shown in FIG. 1C, dummy terminal 8b is electrically connected to the connection point between temperature sensitive resistor 3b and resistor Ra. The temperature of crystal unit 1 is transmitted to temperature sensitive resistor 3b via a conductive path between the connection point and dummy terminal 8b. Temperature sensitive resistor 3b can thus detect the actual temperature of the crystal unit in real time, and the temperature control can properly follow a change in temperature. In this case, dummy terminal 8b is not grounded. However, heat from heating chip resistor 3a travels to crystal unit 1 via second board 4b and the gap. This may delay arrival of the temperature of crystal unit 1 in connection with the temperature set by temperature control circuit 3. Disadvantageously, the temperature control is still prevented from properly following a change in ambient temperature.

Moreover, in the above-described configuration, the surface-mount type crystal unit is mounted on the upper surface of the second board, and the temperature control circuit is located on the lower surface thereof. Thus, reducing the height dimension of the crystal oscillator is difficult.

As a technique relating to the present invention, Japanese Patent Laid-Open Application Nos. 2001-127579 and 2001-308640 (JP-2001-127579A and JP-2001-308640A) disclose crystal oscillators in which a thick-film thermistor element is provided on a surface of a wiring board as a temperature sensitive resistor, and a crystal unit is surface-mounted on the wiring board so as to cover the thick-film thermistor element, thus allowing the temperature of the crystal unit to be accurately sensed and enabling a reduction in height dimension. JP-2001-127579A further discloses a use of a thick-film resistor provided on an outer surface of a container for the crystal unit as a heater for heating the crystal unit.

SUMMARY OF THE INVENTION

An object of the present invention is to provide an oven-controlled crystal oscillator which allows operating temperature control of a crystal unit to properly follow a change in temperature and which can be manufactured so as to have a small size.

The object of the present invention is accomplished by an oven-controlled crystal oscillator including: a crystal unit in which a crystal blank is hermetically encapsulated and which includes a pair of connection terminals provided on a bottom surface thereof and electrically connected to the crystal blank; an oscillating element forming an oscillation circuit together with the crystal unit; a temperature control circuit maintaining operating temperature of the crystal unit constant; and a circuit board on which the crystal unit is surface-mounted, wherein the temperature control circuit includes at least a heating resistor, a power transistor supplying power to the heating resistor, and a temperature sensitive resistor detecting temperature of the crystal unit, and the heating resistor is formed, as a film resistor, on the circuit board in an area of the circuit board in which the crystal unit is located, and the temperature sensitive resistor is formed on the circuit board as a film resistor.

In this configuration, the heating film resistor is provided on the circuit board in an area which lies opposite a bottom surface of the crystal unit which is surface-mounted on the circuit board. Heat generated by the heating film resistor travels uniformly and directly to the bottom surface of the crystal unit. This makes the distribution of temperatures all over the bottom surface of the crystal unit even. Consequently, the efficiency of heat conduction from the heating film resistor to the crystal unit is improved. Thus, the temperature control of the crystal unit can more properly follow a change in temperature.

Furthermore, in this configuration, since the film resistor, for example, a thick-film resistance element, is used and provided on the surface of the circuit board, the height dimension of the crystal oscillator can be reduced.

DETAILED DESCRIPTION OF THE PREFERRED EMBODIMENTS

Figure 1A:
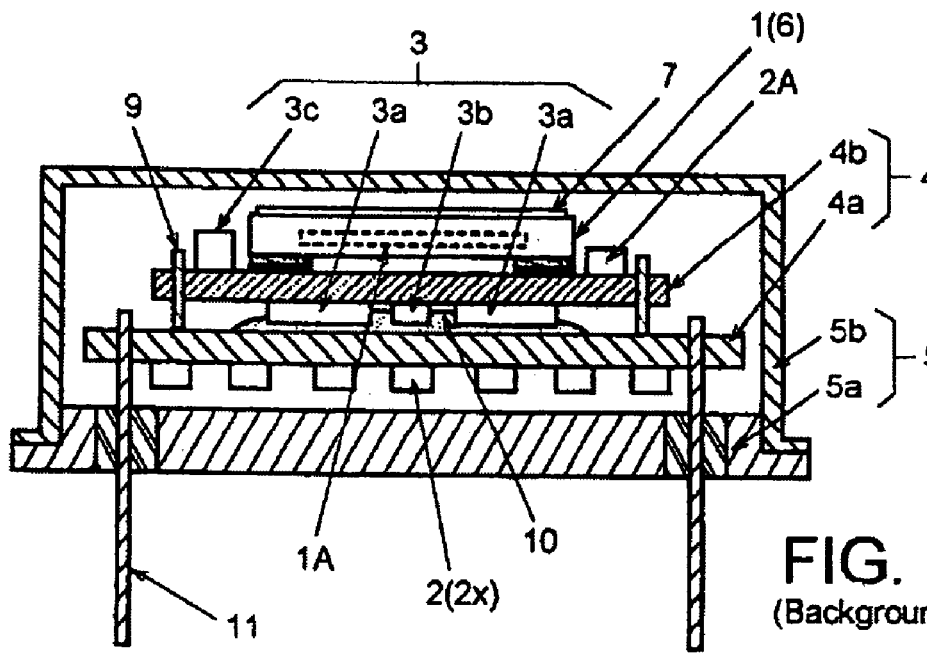
FIG. 1A is a sectional view showing an example of a configuration of a conventional oven-controlled crystal oscillator.
Figure 1B:
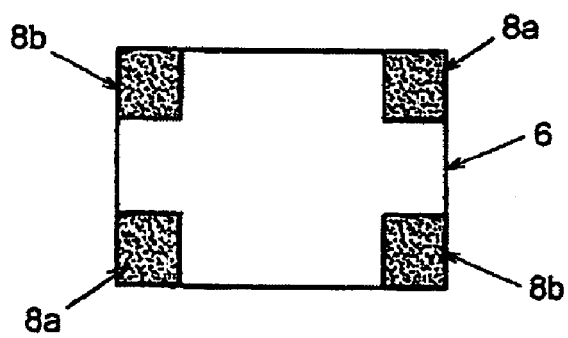
FIG. 1B is a bottom view of a surface-mount type crystal unit used in the crystal oscillator shown in FIG. 1.
Figure 1C:
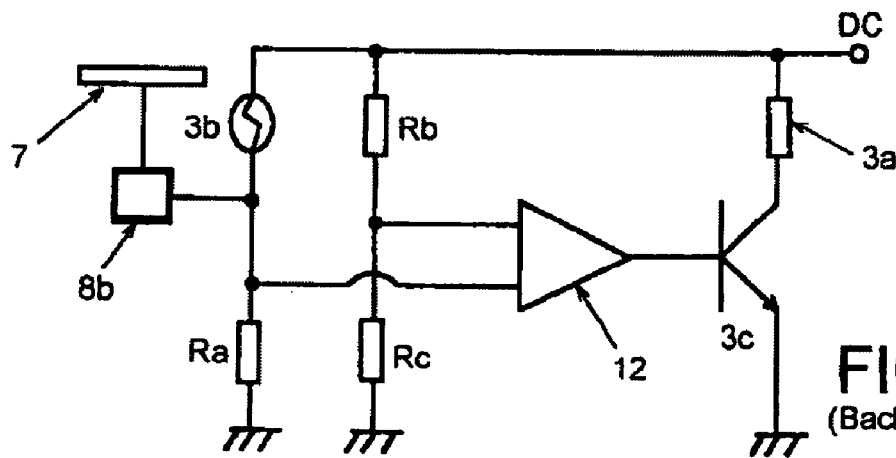
FIG. 1C is a circuit diagram of a temperature control circuit in the crystal oscillator shown in FIG. 1.
Figure 2A:
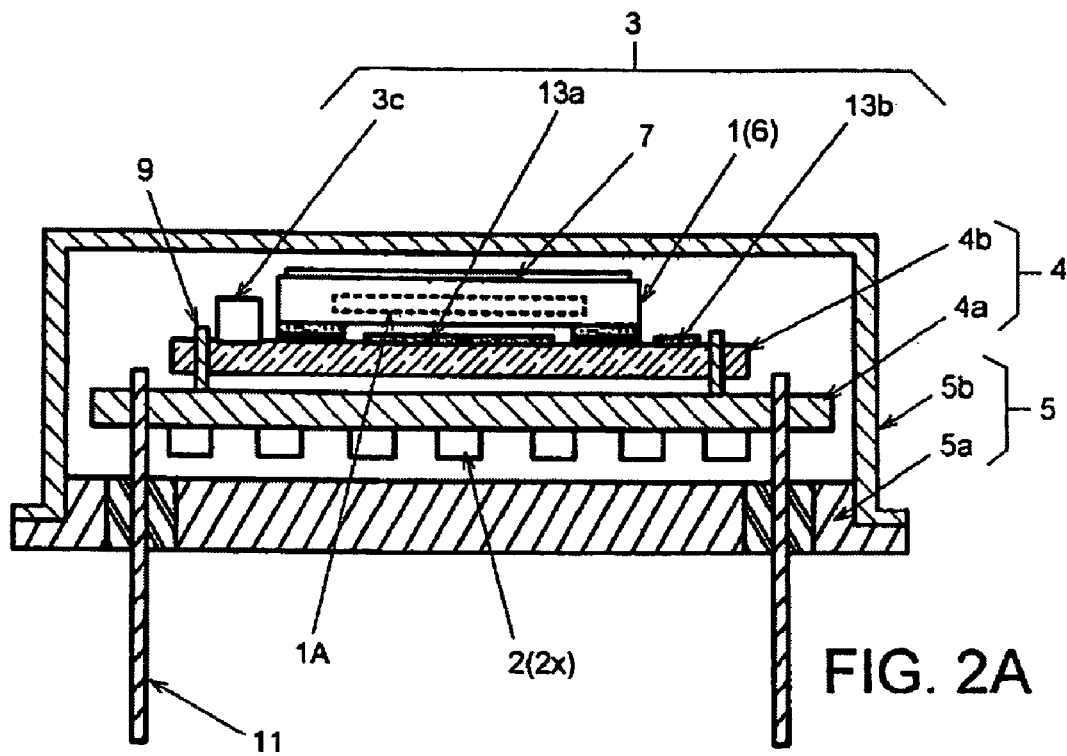
FIG. 2A is a sectional view showing an oven-controlled crystal oscillator according to a first embodiment of the present invention.
Figure 2B:
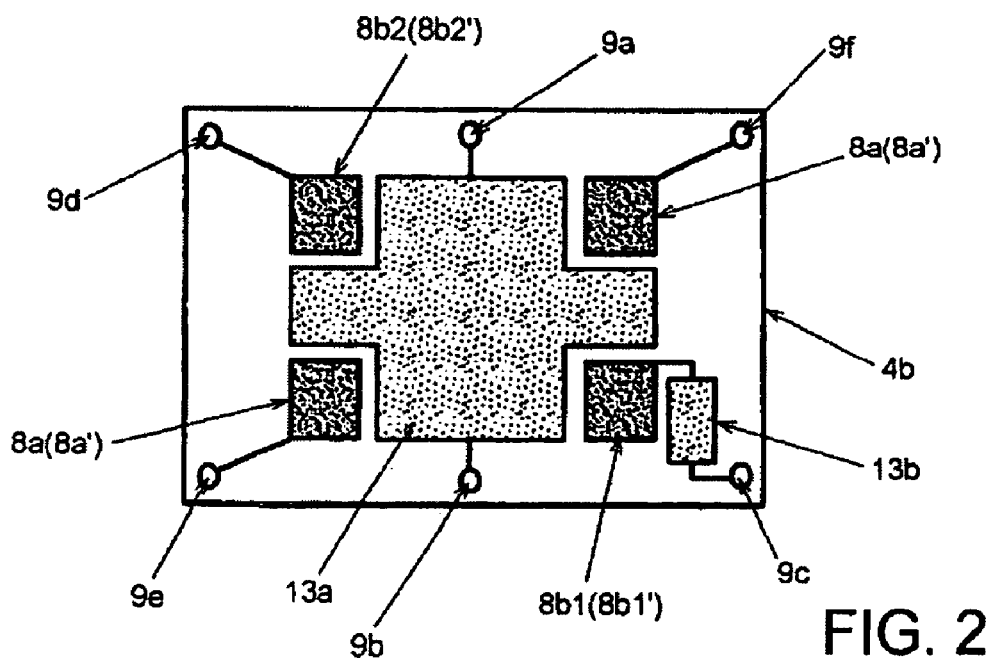
FIG. 2B is a plan view of a second board in the crystal oscillator shown in FIG. 2A.

In FIGS. 2A and 2B showing an oven-controlled crystal oscillator according to a first embodiment of the present invention, the same components as those in FIGS. 1A and 1B are denoted by the same reference numerals. Duplicate descriptions will not be repeated below.

Like the above-described oven-controlled crystal oscillator, an oven-controlled crystal oscillator according to a first embodiment includes, as circuit board 4, first board 4a made up of a glass-epoxy wiring board and second board 4b made up of a ceramic wiring board; first board 4a and second board 4b are arranged in two stages and accommodated in metal container 5. Metal container 5 is made up of metal base 5a and metal cover 5b joined to metal base 5a. A plurality of air-tight terminals 11 are provided so as to penetrate metal base 5a. First board 4a is held by air-tight terminals 11. Second board 4b is held above first board 4a by metal pins 9 which connect second board 4b to first board 4a. Each of first board 4a and second board 4b has a substantially rectangular, planar shape. Circuit elements, mostly oscillating elements 2, are mounted on a lower surface, in the figure, of first board 4a. Quartz crystal unit 1 is secured to an upper surface, in the figure, of second board 4b by means of surface-mounting using solder. Circuit elements of temperature control circuit 3 are also mounted on the upper surface of second board 4b. Although not shown in the drawings, the above-described adjustable elements are also mounted on the upper surface of second board 4b. The adjustable elements are also mounted on the upper surface of the second board in embodiments described below.

No circuit element is mounted on an upper surface of first board 4a or a lower surface of second board 4b. A gap between first board 4a and second board 4b is smaller than that in the crystal oscillator shown in FIG. 1A.

In the present embodiment, instead of a chip resistor, film resistor 13a is used as an element that heats crystal unit 1. Instead of a temperature sensitive chip resistor, film resistor 13b is used as an element that detects the temperature of crystal unit 1. Each of film resistors 13a, 13b is what is called a thick-film resistance element and is formed on the upper surface of second board 4b by a printing method. Second board 4b is formed by burning a ceramic green sheet, i.e., a ceramic raw sheet. Film resistors 13a, 13b are formed by printing a pattern of resistance material on an unburned ceramic raw sheet and then burning the ceramic raw sheet. In the illustrated example, heating film resistor 13a is provided on the upper surface of second board 4b and below the bottom surface of crystal unit 1.

When crystal unit 1 with such a terminal arrangement as shown in FIG. 1B is used, four circuit terminals to which mounting terminals 8 (i.e., connection terminals and dummy terminals) of crystal unit 1 are connected are provided in association with mounting terminals 8. Here, the circuit terminals are arranged, as electrode layers with a rectangular, planar shape, in four corners of a rectangular area corresponding to an area in which the crystal unit is mounted. Here, the circuit terminals corresponding to pair of connection terminals 8a of crystal unit 1 are called circuit terminals 8a'. The circuit terminals corresponding to pair of dummy terminals 8b1, 8b2 are called circuit terminals 8b1', 8b2'. Metal pins 9c to 9f penetrate the four corners of second board 4b to hold second board 4b above first board 4a, while electrically connecting second board 4b to first board 4a. The four circuit terminals are electrically connected to respective metal pins 9c to 9f.

Heating film resistor 13a is provided on the upper surface of second board 4b in a rectangular area thereof corresponding to the mounting area of crystal unit 1, except the area where the circuit terminals are formed. Heating film resistor 13a thus has a cross-like planar shape. Vertically opposite ends, in the figure, of film resistor 13a are used for electric connection to power supply DC and power transistor 3c, and are electrically connected to metal pins 9a, 9b penetrating second board 4b.

Figure 3:
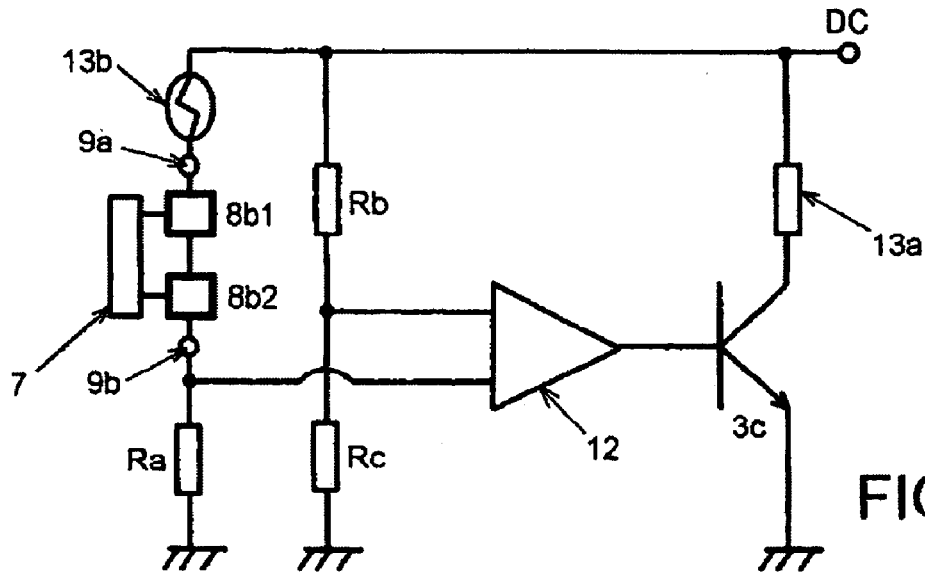
FIG. 3 is a circuit diagram showing a connection between a temperature sensitive film resistor and a dummy terminal in the crystal oscillator shown in FIG. 2A.

Outside the mounting area of crystal unit 1, temperature sensitive film resistor 13a is formed on second board 4b and close to circuit terminal 8b1'. One end of temperature sensitive film resistor 13a is connected to metal pin 9c connected to the DC power supply. The other end of temperature sensitive film resistor 13a is connected to one of the dummy terminals of crystal unit 1, that is, dummy terminal 8b1, via circuit terminal 8b1'. As shown in a circuit diagram in FIG. 3, dummy terminal 8b1 is connected directly to other dummy terminal 8b2 via a conductive path provided in container body 6 of crystal unit 1. Further, dummy terminals 8b1, 8b2 are electrically connected to metal cover of crystal unit 1 via via-holes formed in container body 6. Also in the present embodiment, dummy terminals 8b1, 8b2 are not at a ground potential.

The resistance values of heating and temperature detecting film resistors 13a, 13b are adjusted by a technique such as trimming. That is, slits are formed in film resistors 13a, 13b to set film resistors 13a, 13b at desired values.

Circuit terminal 8b2'0 corresponding to dummy terminal 8b2 is electrically connected to metal pin 9d. Although not shown in FIG. 3, paired connection terminals Ba of crystal unit 1 are connected, via circuit terminal 8a' and metal pins 9e, 9f, to an input end an output end, respectively, of an oscillating amplifier making up the oscillation circuit together with crystal unit 1 Therefore, metal pins 9 holding second board 4b to electrically connect first board 4a and second board 4b together include six metal pins 9a to 9f.

With this configuration, heat generated by film resistor 13a formed on the upper surface of second board 4b in association with the mounting area of crystal unit 1 travels uniformly all over the bottom surface of crystal unit 1. Crystal unit 1 thus responds, in real time, to an operating temperature set by the temperature control circuit. The gap between film resistor 13a and the bottom surface of crystal unit 1 is approximately equal to the thickness of a solder layer used for surface-mounting of crystal unit 1. The thickness of the solder layer is about 100 μm. Therefore, film resistor 13a is located in proximity to the bottom surface of crystal unit 1 to almost directly heats crystal unit 1. To further improve thermal coupling between film resistor 13 and crystal unit 1, for example, adhesive made up of a heat conductive resin may be applied onto film resistor 13 so that the adhesive contacts the bottom surface of crystal unit 1 without space therebetween.

In the conventional oven-controlled crystal oscillator shown in FIGS. 1A and 1B, the crystal unit is heated using a plurality of heating chip resistors 3a, which are discrete elements. The gap between the chip resistors makes the distribution of temperatures over the bottom surface of the crystal unit uneven. This reduces the efficiency of heat conduction from chip resistors 3a to crystal unit 1. In contrast, the crystal oscillator according to the present embodiment uses film resistor 13a extending almost all over the bottom surface of crystal unit. This makes the distribution of temperatures over the bottom surface of crystal unit 1 even, thus improving the heat conduction efficiency.

Temperature detecting resistor 13b is connected to dummy terminal 8b of crystal unit 1 and thermally coupled to metal cover 7 via the via-hole. Thus, the internal temperature of crystal unit 1 can be directly detected in real time via metal cover 7 and dummy terminal 8.

With this crystal oscillator, since the operating temperature of crystal unit 1 responds to heat from film resistor 13a in real time and the detected temperature of film resistor 13b responds to the temperature of crystal unit 1 in real time, the temperature control more properly follows a change in ambient temperature. Since crystal unit 1 operates at a constant set temperature that is, for example, the local minimal value temperature in the frequency-temperature characteristics, the oven-controlled crystal oscillator can accurately maintain frequency stability. Furthermore, instead of the resistor that is a discrete element, the thick-film resistance element is used to heat the crystal unit to detect the temperature of the crystal unit. Thus, according to the present embodiment, the height dimension of the oven-controlled crystal oscillator can be reduced. In the conventional crystal oscillator, the chip resistor, which is a discrete element having a large height dimension, is located opposite the crystal unit across the circuit board and the conventional crystal oscillator accordingly has a larger height dimension.

Figure 4:
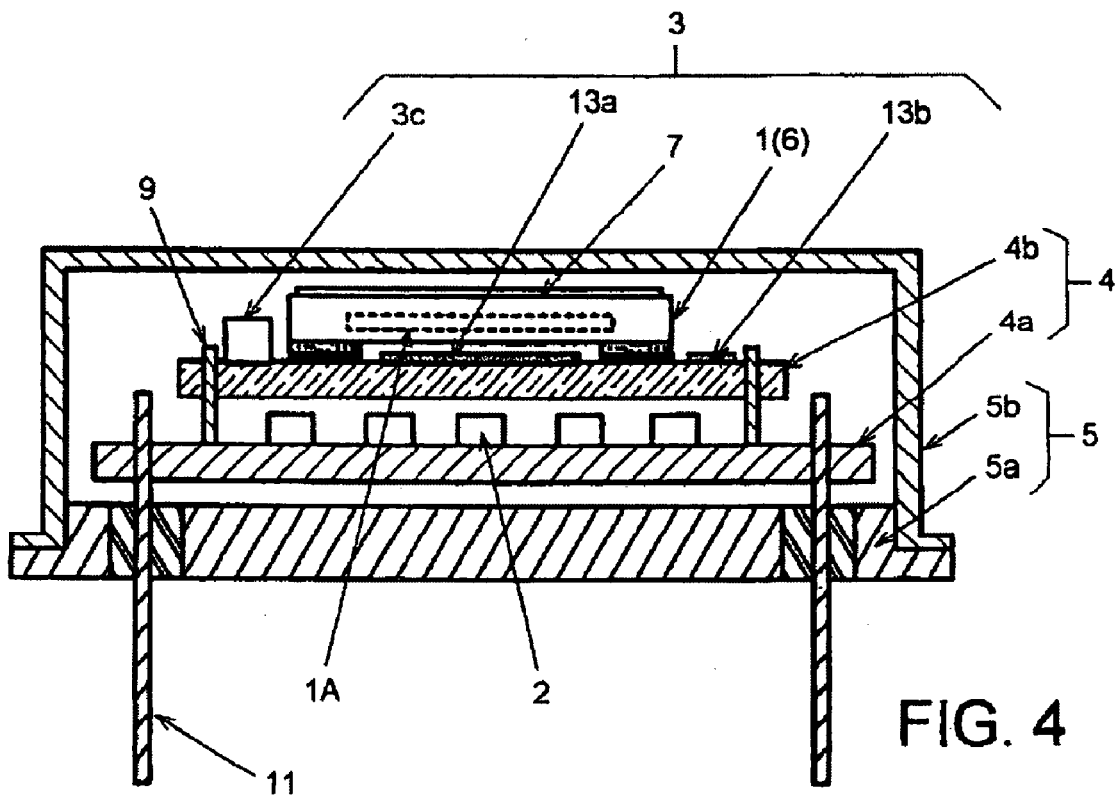
FIG. 4 is a sectional view illustrating another example of the crystal oscillator according to the first embodiment.

FIG. 2A shows that circuit elements 2, mostly oscillating elements, are arranged on the lower surface of first board 4a. However, the arrangement of the circuit elements is not limited to this aspect. In the crystal oscillator shown in FIG. 4, circuit elements 2, mostly oscillating elements, are arranged on the upper surface of first board 4a, with no circuit element provided on the lower surface of first board 4a. Accordingly, a distance between first board 4a and second board 4b in the crystal oscillator shown in FIG. 4 is longer than that shown in FIG. 2A and a distance between first board 4a and metal base 5a shown in FIG. 4 is shorter than that shown in FIG. 2A. In the configuration shown in FIG. 4, circuit elements 2 lie opposite second board 4b, made up of ceramics, which are very thermally conductive. Thus, heat generated by film resistor 13a travels directly to circuit elements 2 via second board 4b. However, since first board 4a is made up of a glass-epoxy board, heat having traveled to second board 4b is blocked by first board 4a. This configuration exerts a high heat insulation effect on the circuit elements 2, allowing the characteristics of the circuit elements, which depend significantly on temperature, to be maintained constant.

Figure 5:
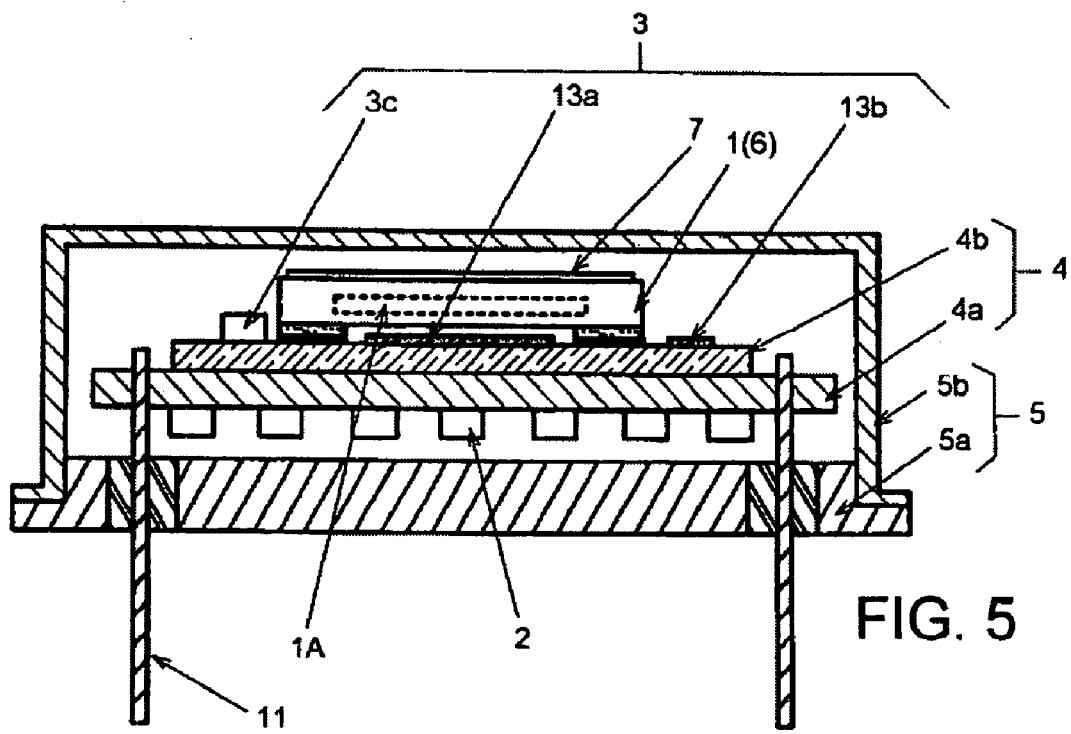
FIG. 5 is a sectional view showing an oven-controlled crystal oscillator according to a second embodiment of the present invention.

An oven-controlled crystal oscillator according to a second embodiment of the present invention will be next described. FIG. 5 shows the crystal oscillator according to the second embodiment. In this specification, for the crystal oscillator according to the second embodiment and other crystal oscillators according to subsequent embodiments, duplicate descriptions of the same components as those in the first embodiment are simplified or omitted.

In the crystal oscillator according to the second embodiment, second board 4b is stacked on first board 4a made up of a glass-epoxy board without using metal pins. Second board 4b includes heating film resistor 13a and temperature sensitive film resistor 13b on ah upper surface thereof and is made up of ceramics. Circuit elements 2 are provided on the lower surface of first board 4a. Wiring paths (not shown) forming an oscillation circuit and a temperature control circuit are formed on the upper surface of first board 4a and the lower surface of second board 4b via through-holes and board end surfaces. The wiring path on the upper surface of first board 4a is joined to the wiring path on the lower surface of second board 4b by soldering.

In this configuration, second board 4b is placed directly on first board 4a without using any metal pin. Thus, compared to the configuration of the first embodiment, the configuration of the second embodiment enables a further reduction in the height dimension of the oven-controlled crystal oscillator. Since second board 4b, made up of ceramics, offering a high heat conductivity, is laminated on first board 4a, made up of a glass-epoxy board, offering a low heat conductivity, heat radiation from the lower surface of second board 4b is blocked. The efficiency of heat conduction from film resistor 13a to crystal unit 1 is thus improved.

Figure 6:
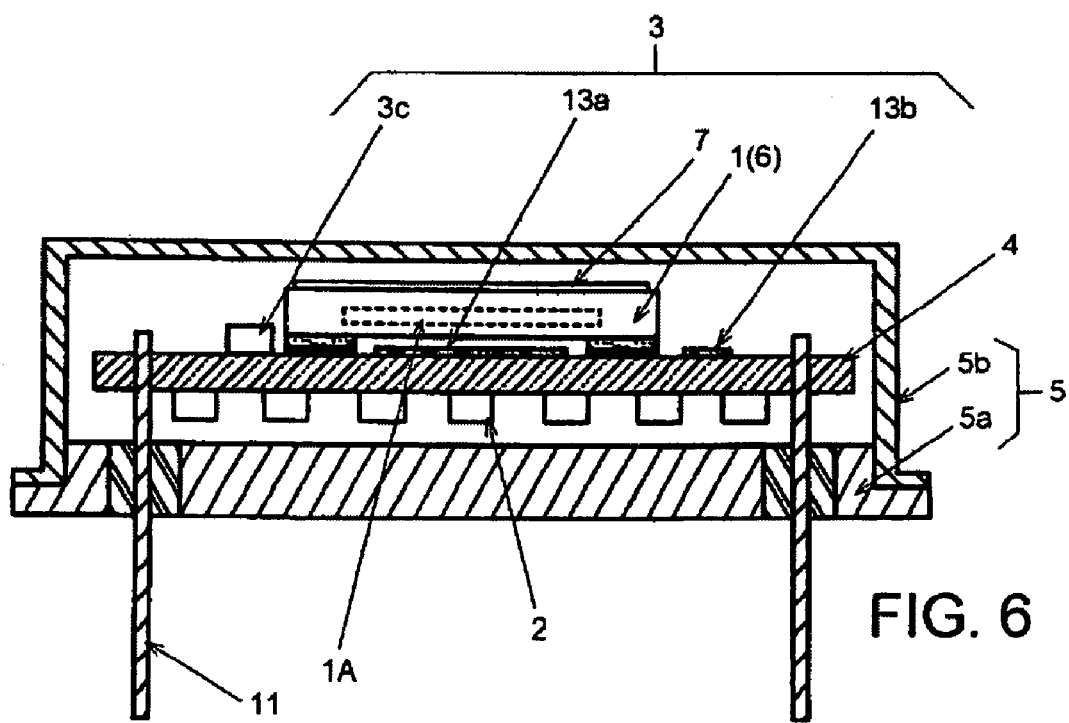
FIG. 6 is a sectional view showing an oven-controlled crystal oscillator according to a third embodiment of the present invention.

An oven-controlled crystal oscillator according to a third embodiment of the present invention will be next described. FIG. 6 shows the crystal oscillator according to the third embodiment.

In both the first and second embodiments, first board 4a and second board 4b are used as a circuit board. However, in the third embodiment, single circuit board 4 made up of ceramics is used. Circuit board 4 is held by a plurality of air-tight terminals 11 provided so as to penetrate metal base 5a. Crystal unit 1 is surface-mounted and temperature control circuit 3 including heating film resistor 13a and temperature sensitive resistor 13b is located, on the upper surface of circuit board 4. Circuit elements 2, mostly oscillating elements, are arranged on the lower surface of circuit board 4. In this configuration, only single circuit board 4 is accommodated in metal container 5. Thus, the height dimension of the oven-controlled crystal oscillator can further be reduced.

Figure 7A:
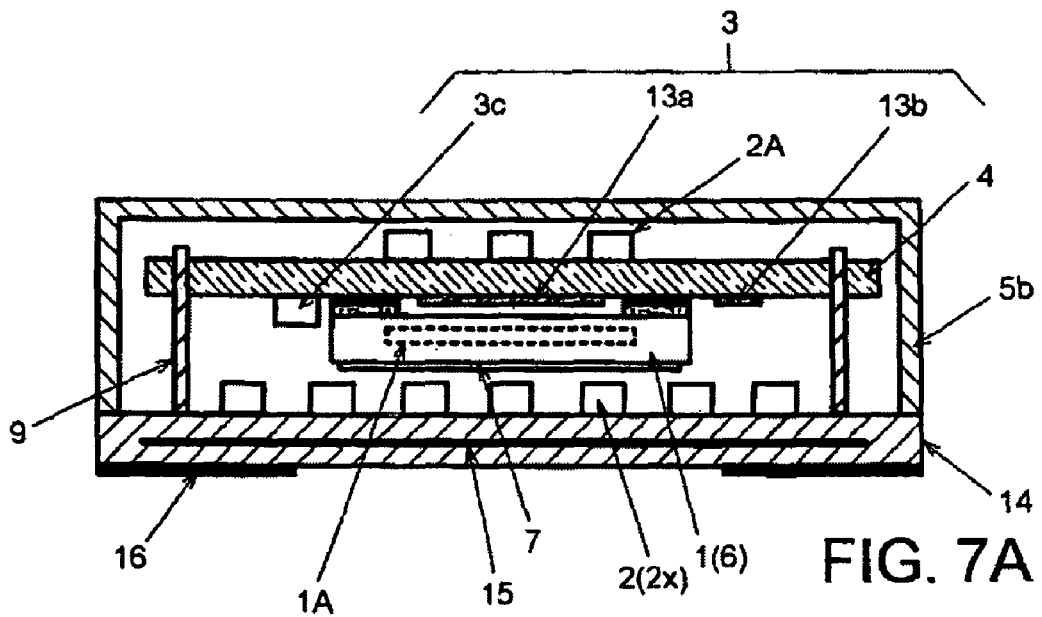
FIGS. 7A to 7C are sectional views showing oven-controlled crystal oscillators according to a fourth embodiment to a sixth embodiment of the present invention, respectively.

An oven-controlled crystal oscillator according to a fourth embodiment of the present invention will be next described. FIG. 7A shows the crystal oscillator according to the fourth embodiment.

Each of the crystal oscillators in the first to third embodiments is a lead-mount type crystal oscillator including the air-tight terminals penetrating the metal base. However, the oven-controlled crystal oscillator based on the present invention can be configured as a surface-mount type crystal oscillator. The crystal oscillator in the fourth embodiment, shown in FIG. 7A, is a surface-mount type oven-controlled thermostatic crystal oscillator. In the crystal oscillator, insulating base 14 made up of a glass-epoxy composite board is used instead of the metal base. Metal cover 5b is joined to insulating base 14. Metal cover 5b and insulating base 14 make up a container in which circuit board 4, crystal unit 1, and circuit elements are closed and sealed. Shielding metal film 15 is provided on a lamination plane in the glass-epoxy composite board of insulating base 14. Instead of the air-tight terminals, mounting terminals 16 used for surface-mounting the crystal oscillator on a wiring board are provided in four corners of an outer bottom surface of insulating base 14.

Metal pins 9 are provided so as to extend upward from a top surface of insulating base 14. Metal pins 9 hold single circuit board 4. Crystal unit 1 is surface-mounted on the lower surface, in the figure, of circuit board 4. Heating film resistor 13a, temperature sensitive film resistor 13b, and transistor 3c of temperature control circuit 3 are also mounted on the lower surface of circuit board 4. As described above, heating film resistor 13a is provided on the lower surface of circuit board 4 in the arrangement area of crystal unit 1. Adjustable elements 2A are located on the upper surface of circuit board 4. Circuit elements 2, mostly oscillating elements, are arranged on the top surface of insulating base 14, including an area located under crystal unit 1.

In this configuration, the use of film resistors 13a, 13b allows the temperature control of the crystal unit to properly follow a change in temperature. Thus, the oscillation frequency can be kept very stable. Furthermore, by using the insulating base instead of the metal base and also placing the circuit elements on the insulating base, the height dimension of the crystal oscillator can be reduced.

Figure 7B:
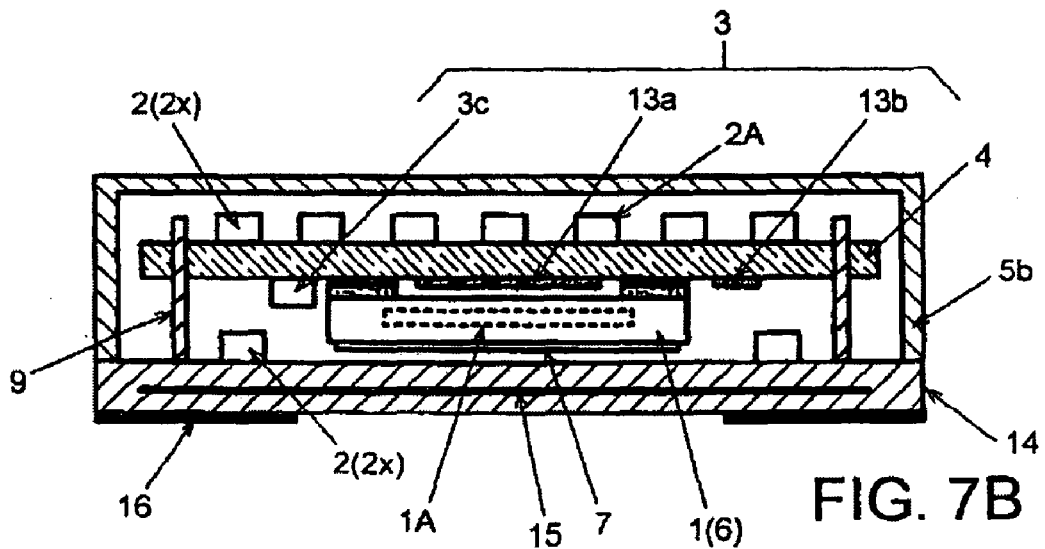

An oven-controlled crystal oscillator according to a fifth embodiment of the present invention will be next described. FIG. 7B shows the crystal oscillator according to the fifth embodiment.

The crystal oscillator according to the fifth embodiment is similar to that according to the fourth embodiment except that no circuit element is provided on an area of the top surface of insulating base 14 which is located under the crystal unit 1, and the circuit elements are arranged only in an outer peripheral area of the top surface of insulating base 14. Instead, adjustable element 2A is provided on the upper surface of circuit board 4, and other circuit elements 2x are also arranged on the upper surface thereof.

This configuration exerts effects similar to those of the fourth embodiment. The configuration also prevents crystal unit 1 from interfering with circuit elements 2 on insulating base 14 to enable a further reduction in the height of the crystal oscillator.

Figure 7C:
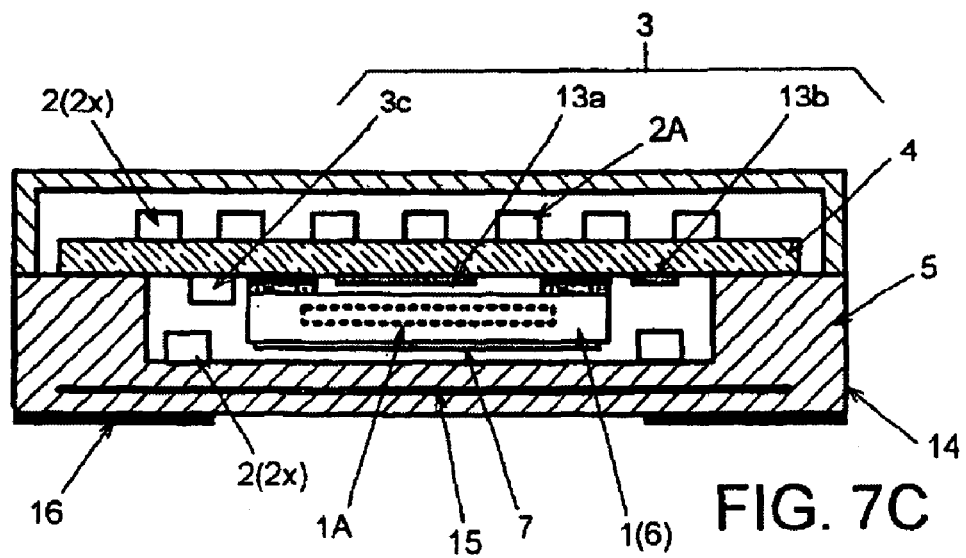

An oven-controlled crystal oscillator according to a sixth embodiment of the present invention will be next described. FIG. 7C shows the crystal oscillator according to the sixth embodiment.

The crystal oscillator according to the sixth embodiment is similar to that according to the fifth embodiment except that no metal pin 9 is used. Specifically, an outer peripheral portion of the top surface of insulating base 14 is thickened so as to form a recess in a central area of the top surface of insulating base 14. Crystal unit 1 and the circuit elements are housed in the recess. To thicken the outer peripheral portion of insulating base 14, the number of glass-epoxy plies laminated together may be increased accordingly.

This configuration exerts effects similar to those of the fifth embodiment. The configuration also avoids the use of the metal pins to enables a reduction in the number of components required, and further allows the structure to be simplified.

Figure 8A:
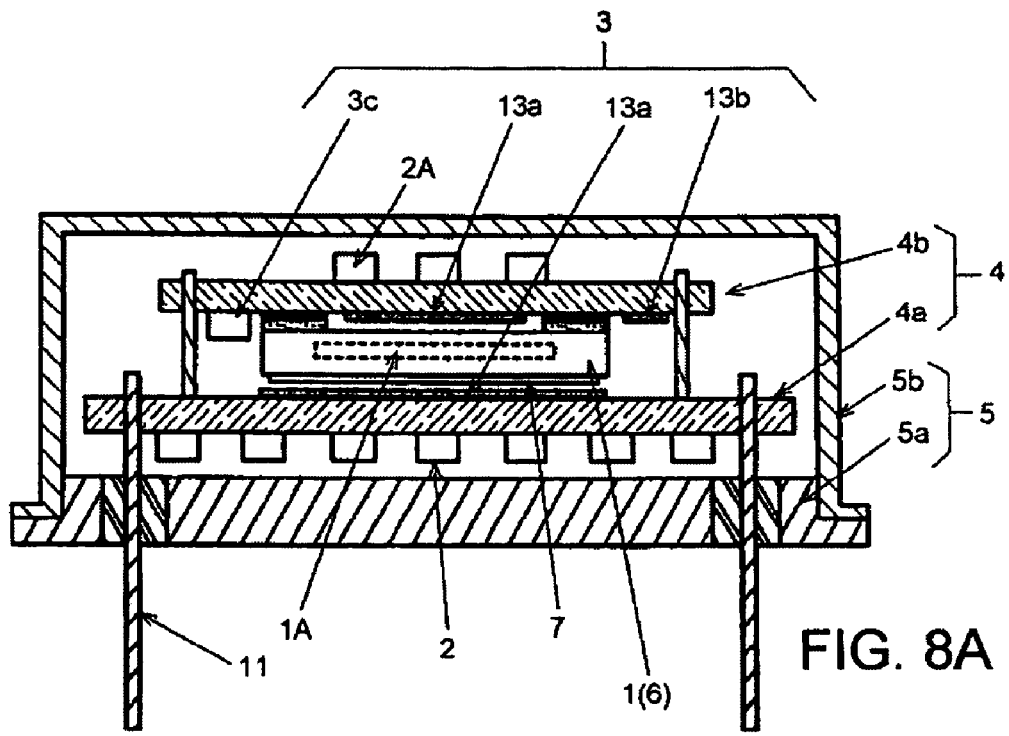
FIGS. 8A and 8B are sectional views showing oven-controlled crystal oscillators according to a seventh embodiment and an eighth embodiment of the present invention, respectively.

An oven-controlled crystal oscillator according to a seventh embodiment of the present invention will be next described. FIG. 8A shows the crystal oscillator according to the seventh embodiment.

The crystal oscillator according to the seventh embodiment corresponds to the crystal oscillator according to the first embodiment in which the material of first board 4a is changed from the glass-epoxy composite board to ceramics and in which another heating film resistor 13a is placed on the upper surface of first board 4a. Heating film resistor 13a is also provided on second board 4b on which crystal unit 1 is surface-mounted. In the present embodiment, to allow crystal unit 1 to be efficiently heated by film resistor 13a on first board 4a, crystal unit 1 is surface-mounted on the lower surface of second board 4b, with metal cover 7 of crystal unit 1 and film resistor 13a on first board 4a arranged in proximity to each other. Film resistor 13a on first board 4a is as large as the outer planar shape of crystal unit 1 and is provided opposite crystal unit 1. Since crystal unit 1 is provided on the lower surface of second board 4b, film resistor 13a, temperature sensitive film resistor 13b, and power transistor 3c on second board 4b are also provided on the lower surface of second board 4b. The shape and location of film resistor 13a provided on the lower surface of second board 4b are similar to those in the above-described embodiments. Adjustable element 2A is located on the upper surface of second board 4b.

In this configuration, crystal unit 1 is heated not only by heat conduction from the bottom surface thereof but also by heat traveling from film resistor 13a, provided on first board 4a, via metal cover 7. The temperature of crystal unit 1 can be increased rapidly, thus allowing the temperature control to properly follow a change in temperature. Additionally, since metal cover 7 offers a higher heat conductivity than ceramics, which make up container body 6, heat is more effectively transferred from metal cover 7 to crystal unit 1 in the crystal oscillator according to the seventh embodiment.

Figure 8B:
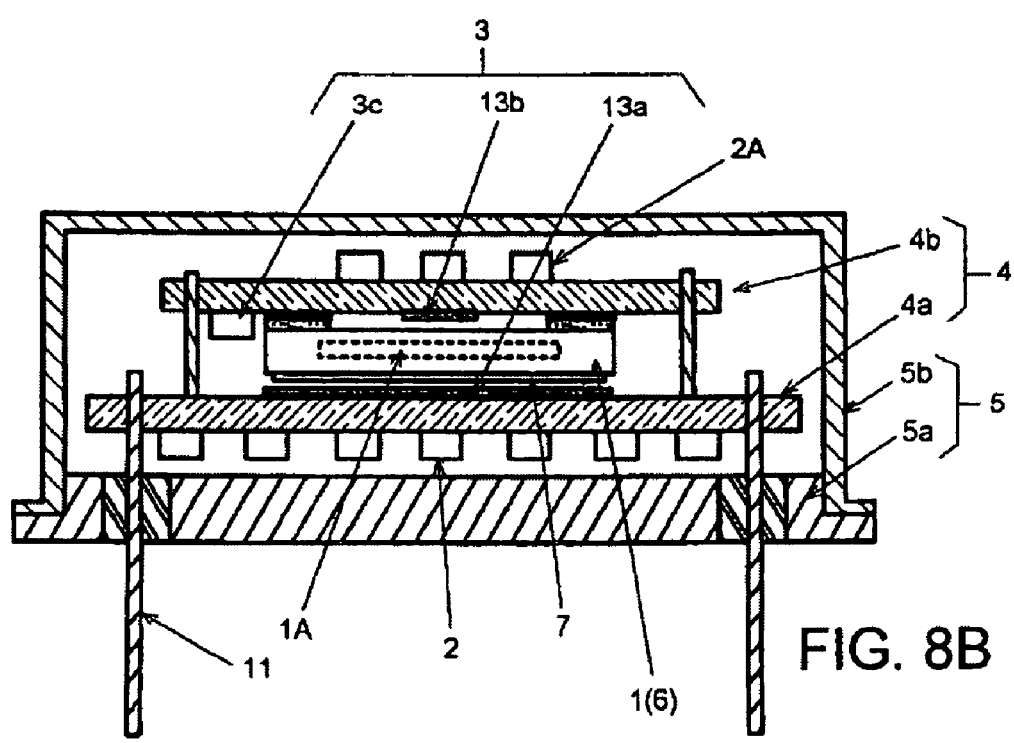

An oven-controlled crystal oscillator according to an eighth embodiment of the present invention will be next described. FIG. 8B shows the crystal oscillator according to the eighth embodiment.

The crystal oscillator according to the eighth embodiment is similar to that according to the seventh embodiment except that heating film resistor 13a is not provided on the lower surface of second board 4b. Instead of heating film resistor, temperature sensitive film resistor 13b is provided on the lower surface of second board 4b at a position which lies opposite the bottom surface of crystal unit 1. In this configuration, heating film resistor 13a and temperature sensitive film resistor 13b are thus arranged on opposite sides across crystal unit 1. Consequently, temperature sensitive film resistor 13b can independently detect the operating temperature of crystal unit 1 without being affected by heat transferred directly from heating film resistor 13a. Since the actual operating temperature of crystal unit 1 is equal to the temperature detected by temperature sensitive film resistor 13b, the crystal oscillator according to the eighth embodiment can be easily designed and adjusted. Alternatively, temperature sensitive film resistor 13b may be provided on first board 4a, whereas heating film resistor 13a may be provided on second board 4b.

Figure 9:
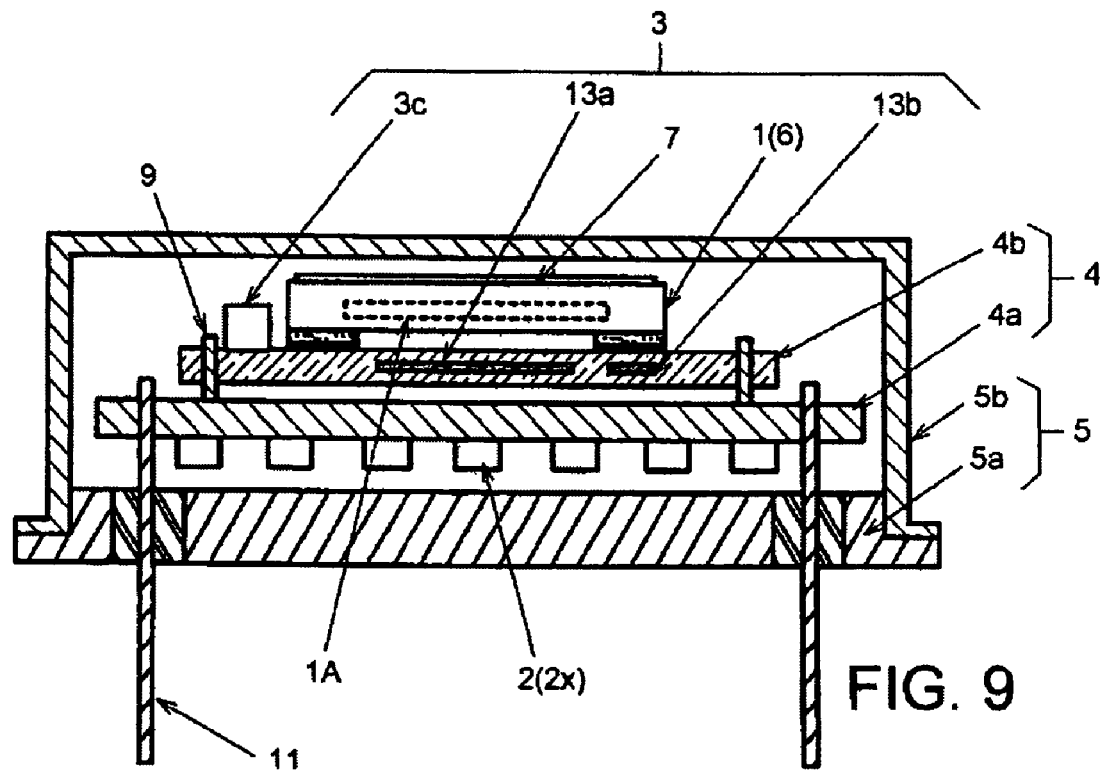
FIG. 9 is a sectional view showing an oven-controlled crystal oscillator according to another embodiment of the present invention.

In the first to seventh embodiments, described above, heating film resistor 13a and temperature sensitive film resistor 13b are provided on the surface of second board 4b. However, the arrangement of film resistors 13a, 13b is not limited to this aspect. For example, as shown in FIG. 9, second board 4b made up of ceramics may be configured as a ceramic laminate board in which heating film resistor 13a and temperature sensitive resistor 13b are buried. If heating film resistor 13a and temperature sensitive resistor 13b are provided on first board 4a, first board 4a may be similarly configured as a laminate board so that heating film resistor 13a and temperature sensitive resistor 13b can be provided inside first board 4a.

Figure 10:
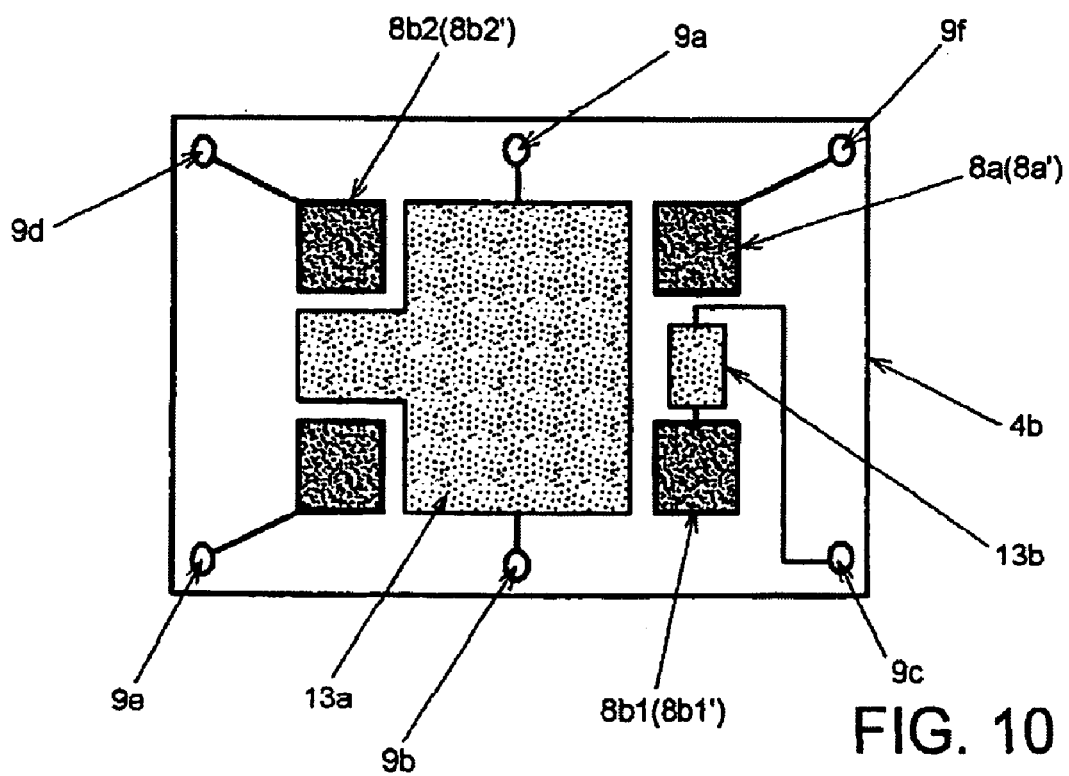
FIG. 10 is a plan view showing a second board used in an oven-controlled oscillator according to yet another embodiment of the present invention.

In the above-described first to seventh embodiments, heating film resistor 13a is formed on second board 4b in the cross-like area surrounded by the four circuit terminals, and temperature sensitive film resistor 13b is provided outside the arrangement area of crystal unit 1. However, the place in which temperature sensitive film resistor 13b is provided is not limited to this aspect. For example, as shown in FIG. 10, temperature sensitive film resistor 13b may be provided on the surface of second board 4b in an area sandwiched between paired circuit terminals 8a', 8b1'. In this case, heating film resistor 13a is not formed in the area in which temperature sensitive film resistor 13b is provided. As a result, heating film resistor 13a is formed like the letter T instead of the cross.

In this embodiment, both heating film resistor 13a and temperature sensitive film resistor 13b are provided on second board 4b and in the arrangement area of crystal unit 1. The outer planar shape of second board 4b can thus be reduced.

What is claimed is:

1. An oven-controlled crystal oscillator, comprising:
  a crystal unit in which a crystal blank is hermetically encapsulated and which includes a pair of connection terminals electrically connected to the crystal blank;
  an oscillating circuit element forming an oscillation circuit together with the crystal unit;
  a temperature control circuit maintaining operating temperature of the crystal unit constant; and
  a circuit board on which the crystal unit is surface-mounted,
  wherein the temperature control circuit includes at least a heating resistor, a power transistor supplying power to the heating resistor, and a temperature sensitive resistor detecting temperature of the crystal unit,
  wherein the heating resistor is formed, as a film resistor, on a surface of the circuit board in an area of the circuit board in which the crystal unit is located,
  wherein the temperature sensitive resistor is formed on the surface of the circuit board as a film resistor,
  wherein the crystal unit further includes: a pair of dummy terminals; a container body with a recess; and a metal cover joined to the container body,
  wherein the pair of the connection terminals and the pair of the dummy terminals constitute four mounting terminals which are used for surface-mounting the crystal oscillator on the circuit board and provided on an outer bottom surface of the container body,
  wherein four circuit terminals corresponding to the four mounting terminals, respectively, are formed on the surface of the circuit board, and
  wherein the heating resistor is formed in a cross-like planar shape in the area of the circuit board in which the crystal unit is located so that the heating resistor is separated from the circuit terminals, and the heating resistor faces to the outer bottom surface of the container body.

2. The crystal oscillator according to claim 1, wherein the temperature sensitive resistor is formed in proximity to the circuit terminal corresponding to one of the dummy terminals and outside the area of the circuit board in which the crystal unit is located, and is electrically connected to the dummy terminal via a wiring path.

3. The crystal oscillator according to claim 2, wherein the dummy terminal is electrically connected to the metal cover.

4. An oven-controlled crystal oscillator, comprising:
  a crystal unit in which a crystal blank is hermetically encapsulated and which includes a pair of connection terminals electrically connected to the crystal blank;
  an oscillating circuit element forming an oscillation circuit together with the crystal unit;
  a temperature control circuit maintaining operating temperature of the crystal unit constant; and
  a circuit board on which the crystal unit is surface-mounted,
  wherein the temperature control circuit includes at least a heating resistor, a power transistor supplying power to the heating resistor, and a temperature sensitive resistor detecting temperature of the crystal unit,
  wherein the heating resistor is formed, as a film resistor, on a surface of the circuit board in an area of the circuit board in which the crystal unit is located,
  wherein the temperature sensitive resistor is formed on the surface of the circuit board as a film resistor,
  wherein the crystal unit further includes: a pair of dummy terminals; a container body with a recess; and a metal cover joined to the container body,
  wherein the pair of the connection terminals and the pair of the dummy terminals constitute four mounting terminals which are used for surface-mounting the crystal oscillator on the circuit board and provided on an outer bottom surface of the container body,
  wherein four circuit terminals corresponding to the four mounting terminals, respectively, are formed on the surface of the circuit board,
  wherein the temperature sensitive resistor is formed at a position between two of the circuit terminals corresponding to the dummy terminals, and
  wherein the heating resistor is formed in a T shape in the area of the circuit board in which the crystal unit is located so that the heating resistor is separated from the circuit terminals and the temperature sensitive resistor, and the heating resistor faces to the outer bottom surface of the container body.

5. The crystal oscillator according to claim 4, wherein the temperature sensitive resistor is formed in proximity to the circuit terminal corresponding to one of the dummy terminals and is electrically connected to the dummy terminal via a wiring path.

6. The crystal oscillator according to claim 5, wherein the dummy terminal is electrically connected to the metal cover.

* * * * *